(12) United States Patent
Saito et al.

(10) Patent No.: US 12,272,710 B2
(45) Date of Patent: Apr. 8, 2025

(54) SEMICONDUCTOR DEVICE AND EQUIPMENT

(71) Applicant: Canon Kabushiki Kaisha, Tokyo (JP)

(72) Inventors: Kazuhiro Saito, Tokyo (JP); Satoshi Kato, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 684 days.

(21) Appl. No.: 17/192,088

(22) Filed: Mar. 4, 2021

(65) Prior Publication Data

US 2021/0280627 A1    Sep. 9, 2021

(30) Foreign Application Priority Data

Mar. 5, 2020 (JP) ................................. 2020-037964

(51) Int. Cl.
 *H01L 27/146*     (2006.01)
 *H01L 23/00*      (2006.01)
(52) U.S. Cl.
 CPC ........ *H01L 27/14634* (2013.01); *H01L 24/08* (2013.01); *H01L 27/14636* (2013.01); *H01L 2224/08145* (2013.01)
(58) Field of Classification Search
 CPC ......... H01L 27/14603; H01L 27/14636; H01L 27/14641; H01L 2224/08145;
 (Continued)

(56) References Cited

U.S. PATENT DOCUMENTS 8,810,706 B2 * 8/2014 Yamazaki ............ H04N 25/767
                                                348/241
8,928,786 B2 * 1/2015 Iwata ................... H04N 25/627
                                                348/294
(Continued)

FOREIGN PATENT DOCUMENTS

EP       3288081 A1    2/2018
JP    2012104684 A     5/2012
(Continued)

OTHER PUBLICATIONS

Japanese Office Action issued Nov. 30, 2023 in counterpart Japanese Patent Appln. No. 2020-037964.
(Continued)

*Primary Examiner* — Jay C Chang
*Assistant Examiner* — Mikka Liu
(74) *Attorney, Agent, or Firm* — Venable LLP

(57) ABSTRACT

The semiconductor device includes a first semiconductor component including a first circuit section and an interconnection connected to the first circuit section, and a second semiconductor component including a second circuit section and a third circuit section and stacked on the first semiconductor component. The interconnection is electrically connected to a first connecting portion and a second connecting portion of a plurality of connecting portions for electrically connecting the first semiconductor component and the second semiconductor component. The second circuit section is electrically connected to the interconnection via the first connecting portion. The third circuit section is electrically connected to the interconnection via the second connecting portion.

18 Claims, 10 Drawing Sheets

(58) Field of Classification Search
CPC ............... H01L 25/0657; H01L 25/18; H01L 27/14634; H01L 2225/06527; H01L 24/08; H04N 25/77

See application file for complete search history.

(56) References Cited

U.S. PATENT DOCUMENTS

| | | | | |
|---|---|---|---|---|
| 9,053,771 | B2* | 6/2015 | Yokou | G11C 11/4074 |
| 9,204,072 | B2* | 12/2015 | Hiyama | H04N 17/002 |
| 9,349,714 | B2* | 5/2016 | Nakamura | H01L 24/97 |
| 9,515,050 | B2* | 12/2016 | Uchiyama | H01L 24/96 |
| 9,712,767 | B2 | 7/2017 | Mabuchi | |
| 9,847,365 | B2* | 12/2017 | Hotellier | H01L 27/14687 |
| 10,051,223 | B2* | 8/2018 | Yamashita | H01L 27/14612 |
| 10,110,835 | B2* | 10/2018 | Onuki | H04N 25/771 |
| 10,554,910 | B2 | 2/2020 | Sukegawa et al. | |
| 2013/0141617 | A1* | 6/2013 | Soda | H01L 27/14634 716/120 |
| 2018/0109741 | A1* | 4/2018 | Sukegawa | H04N 23/65 |
| 2019/0165060 | A1* | 5/2019 | Choi | H10K 59/873 |
| 2019/0189722 | A1* | 6/2019 | Lim | H10K 59/123 |
| 2019/0267416 | A1* | 8/2019 | Kohama | H04N 25/75 |
| 2019/0305028 | A1 | 10/2019 | Soda et al. | |
| 2020/0411579 | A1 | 12/2020 | Soda et al. | |

FOREIGN PATENT DOCUMENTS

| | | | | |
|---|---|---|---|---|
| JP | 2015056878 | A | | 3/2015 |
| JP | 2015139081 | A | | 7/2015 |
| JP | 2016105571 | A | | 6/2016 |
| JP | 2018007000 | A | | 1/2018 |
| JP | 2018046484 | A | | 3/2018 |
| JP | 2019179859 | A | | 10/2019 |
| KR | 20150060541 | A | * 6/2015 ....... H01L 27/14634 |
| WO | 2016170833 | A1 | | 10/2016 |
| WO | 2017209221 | A1 | | 12/2017 |
| WO | 2018186192 | A1 | | 10/2018 |

OTHER PUBLICATIONS

Japanese Office Action dated Apr. 16, 2024 in counterpart Japanese Patent Appln. No. 2020-037964.

* cited by examiner

SEMICONDUCTOR DEVICE AND EQUIPMENT

BACKGROUND OF THE INVENTION

Field of the Invention

The present invention relates to a semiconductor device and an equipment.

Description of the Related Art

In recent years, a solid-state imaging device in which multiple semiconductor components are stacked has been proposed. Japanese Patent Application Laid-Open No. 2012-104684 discloses a solid-state imaging device in which a substrate having a pixel unit and a substrate having a readout circuit are stacked to reduce a voltage drop due to an interconnection resistance of a vertical signal line and to improve shading caused by the voltage drop.

However, in Japanese Patent Application Laid-Open No. 2012-104684, an impedance component generated at connections between the semiconductor components has not been sufficiently studied, and there is room for improvement in order to further enhance the performance of the solid-state imaging device. The same problem may occur not only in a solid-state imaging device but also in a semiconductor device in which multiple semiconductor components are stacked.

SUMMARY OF THE INVENTION

The present invention intends to provide a technique for improving the form of a connection between semiconductor components and improving the characteristics in a semiconductor device formed by stacking a plurality of semiconductor components.

According to one aspect of the present invention, provided is a semiconductor device including a first semiconductor component including a first circuit section and an interconnection connected to the first circuit section, and a second semiconductor component including a second circuit section and a third circuit section and stacked on the first semiconductor component, wherein the interconnection is electrically connected to a first connecting portion and a second connecting portion of a plurality of connecting portions for electrically connecting the first semiconductor component and the second semiconductor component, wherein the second circuit section is electrically connected to the interconnection via the first connecting portion, and wherein the third circuit section is electrically connected to the interconnection via the second connecting portion.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
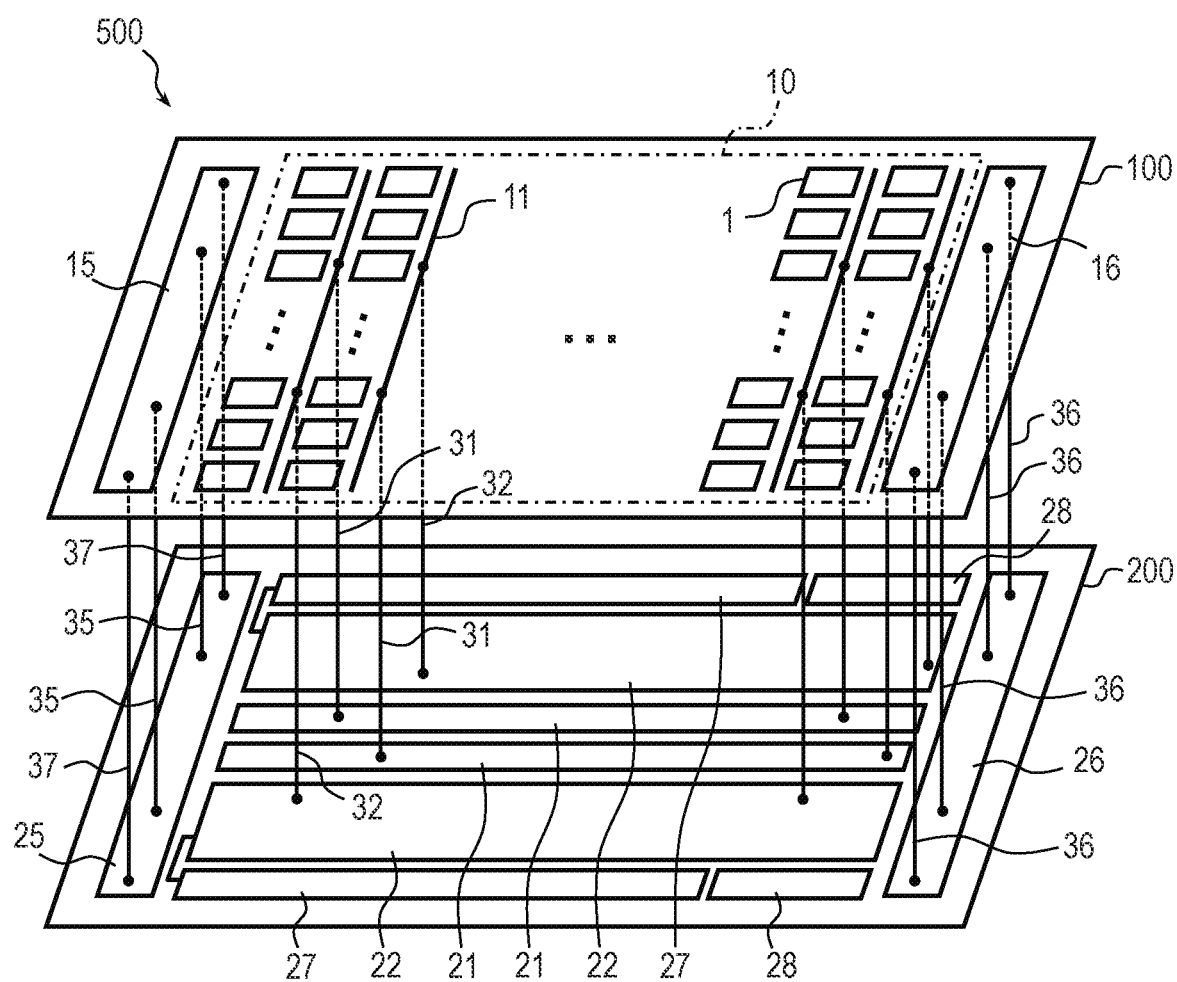
FIG. 1 is a schematic diagram illustrating a general configuration of a photoelectric conversion device according to a first embodiment of the present invention.
Figure 2:
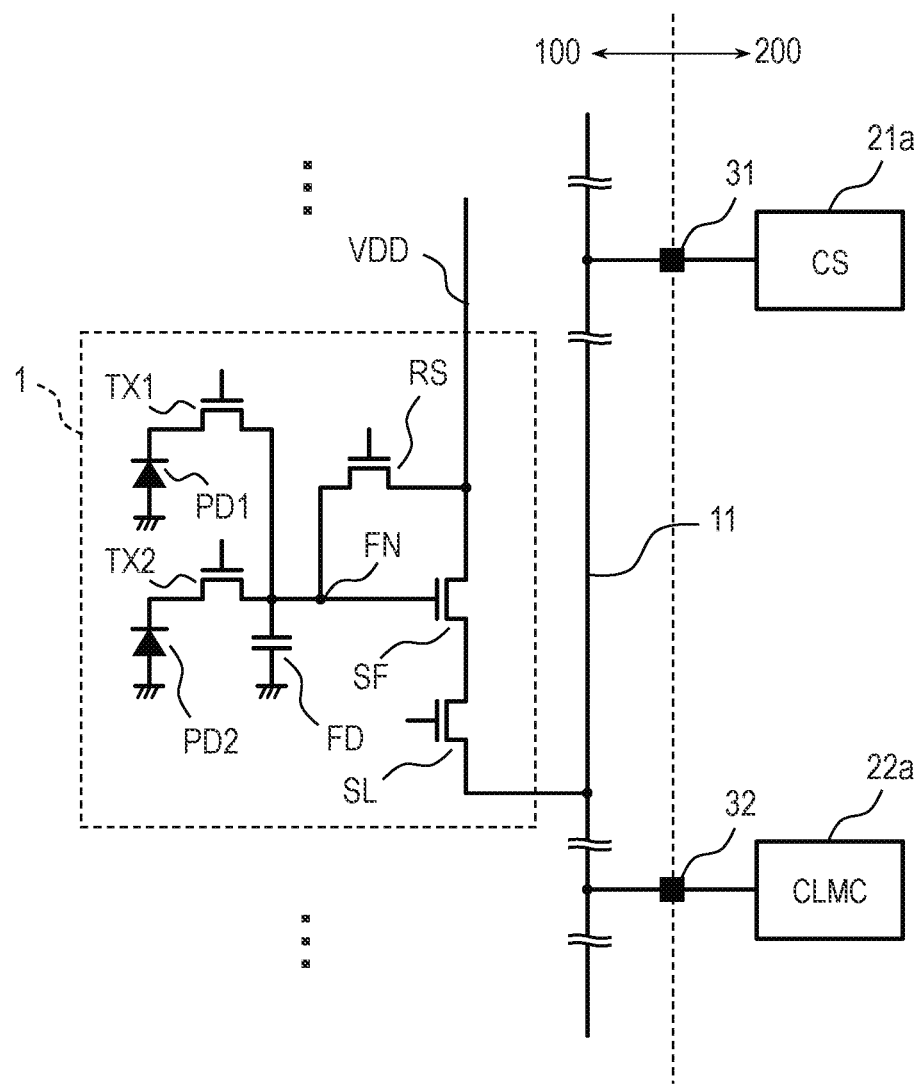
FIG. 2 is an equivalent circuit diagram illustrating a configuration example of a pixel circuit in the photoelectric conversion device according to the first embodiment of the present invention.
Figure 3:
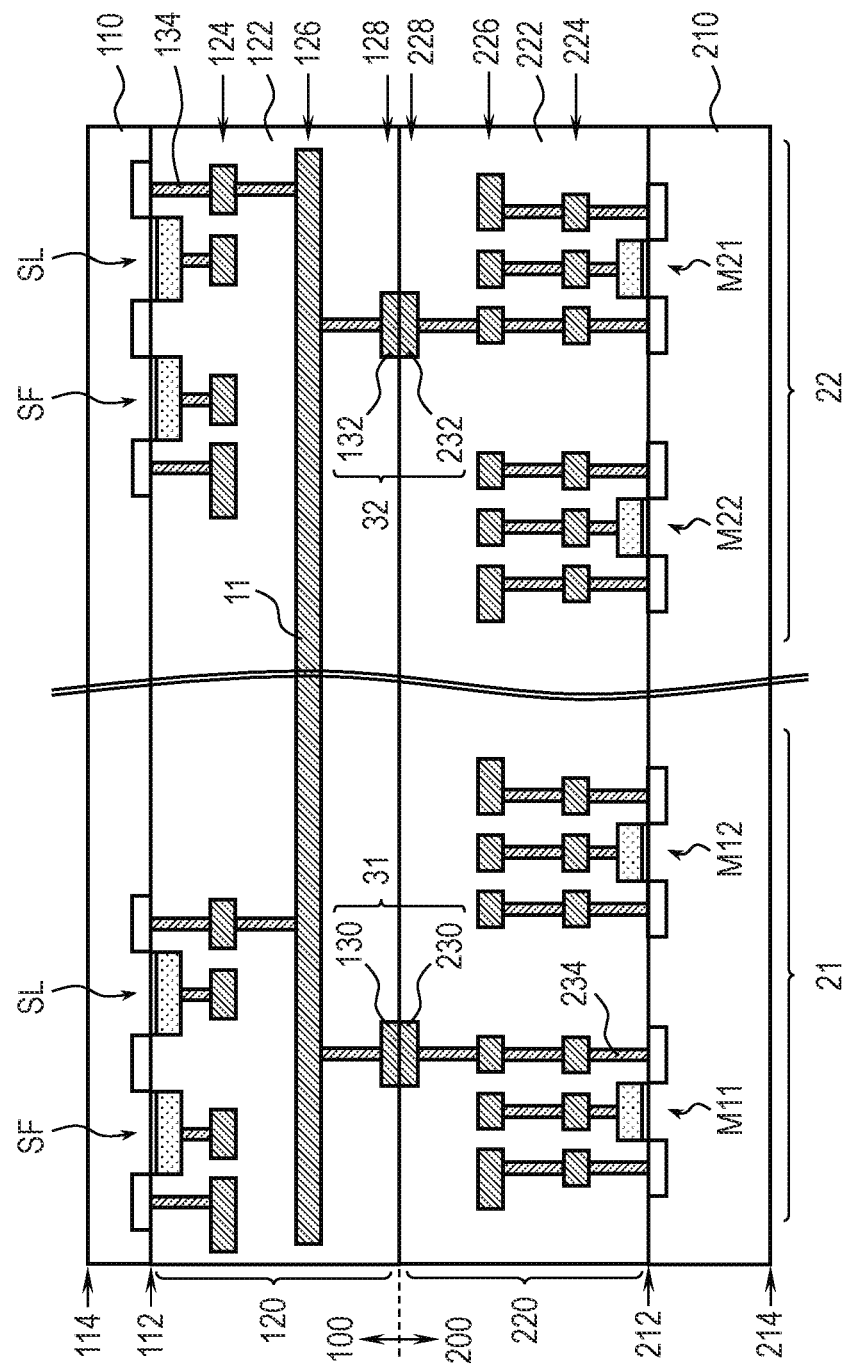
FIG. 3 is a schematic cross-sectional view illustrating a configuration example of the photoelectric conversion device according to the first embodiment of the present invention (Part 1).
Figure 4:
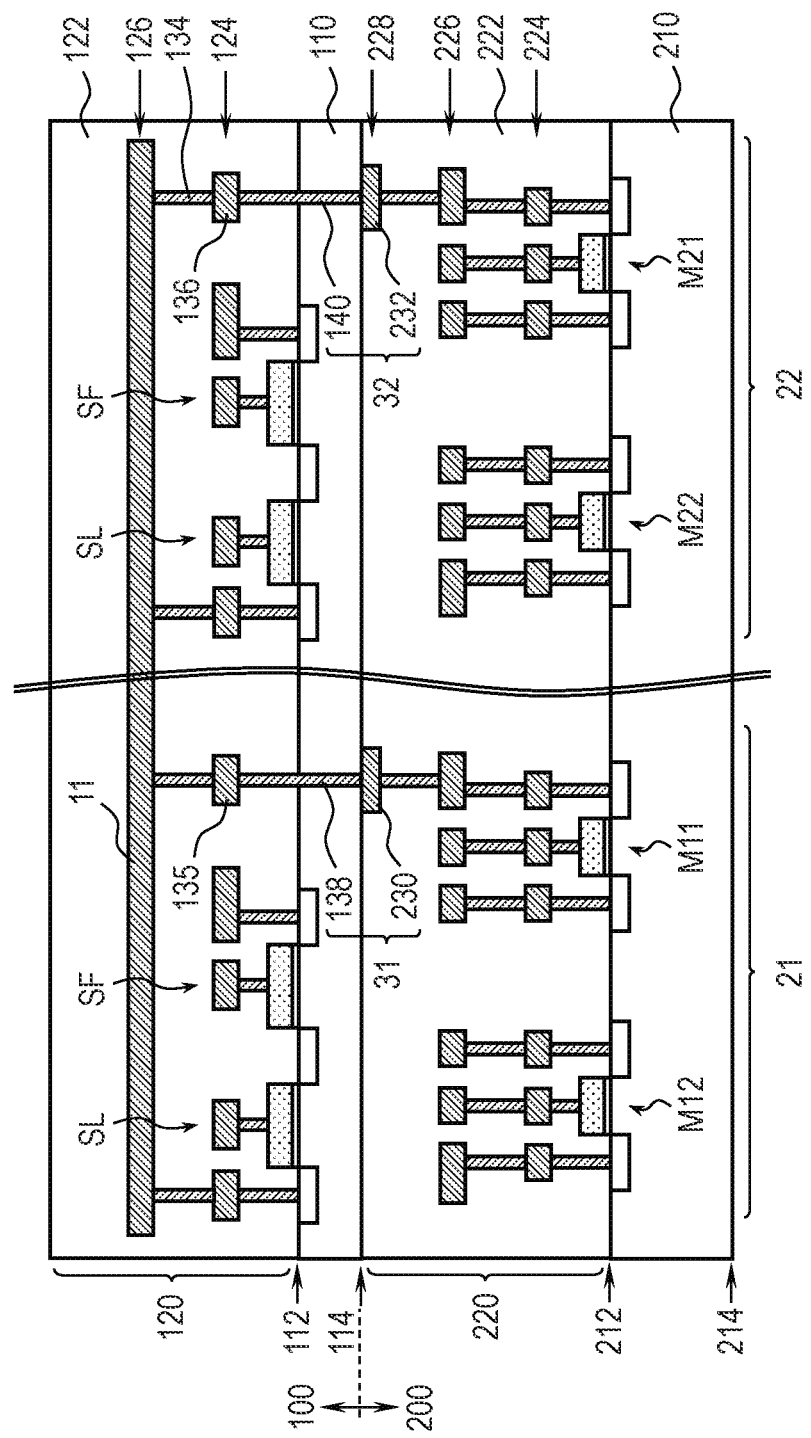
FIG. 4 is a schematic cross-sectional view illustrating a configuration example of the photoelectric conversion device according to the first embodiment of the present invention (Part 2).
Figure 5:
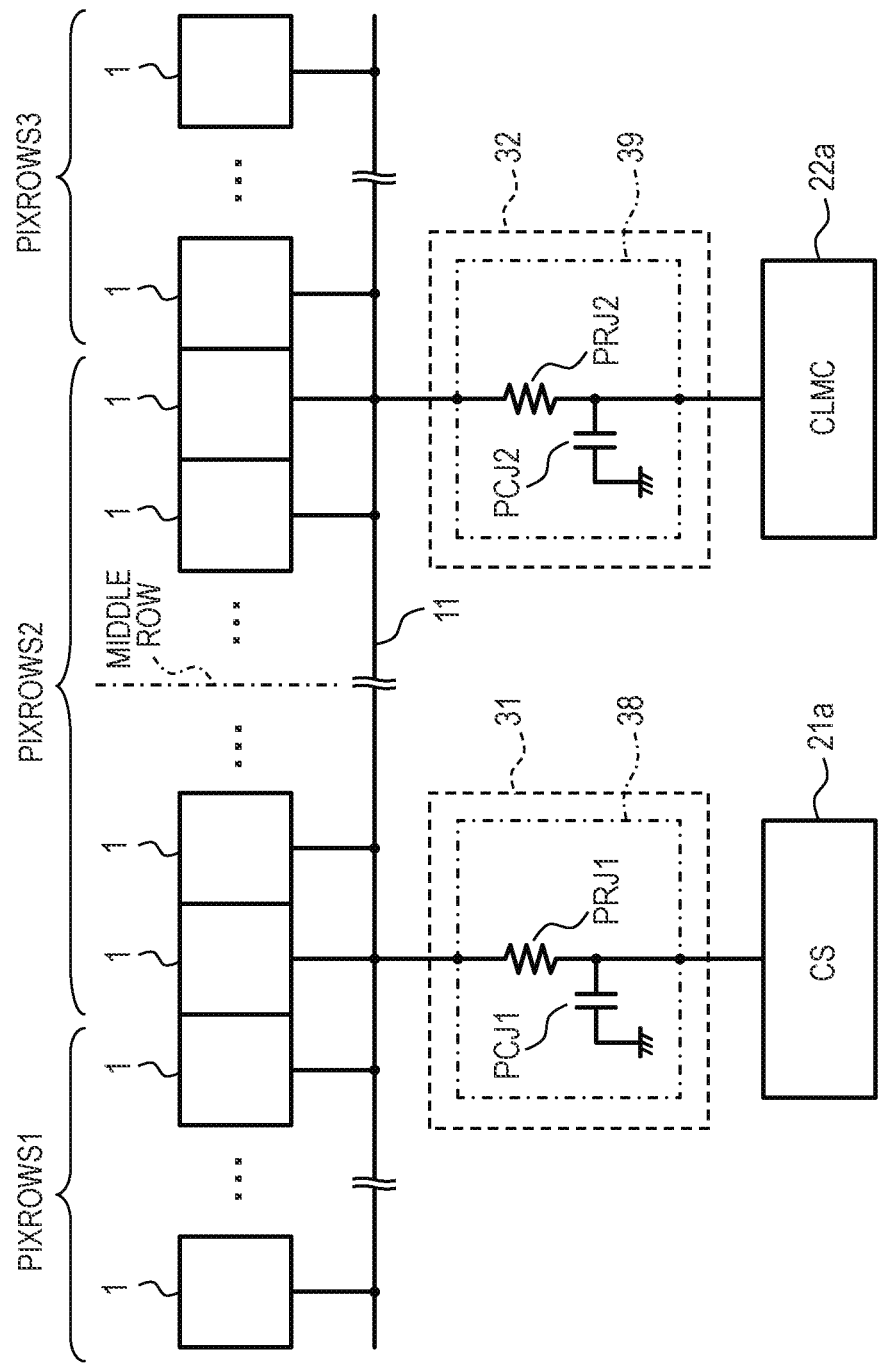
FIG. 5 is a schematic diagram illustrating a configuration example of a connecting portion in the photoelectric conversion device according to the first embodiment of the present invention.

A semiconductor device according to a first embodiment of the present invention will be described with reference to FIG. 1 to FIG. 5. The semiconductor device according to the present embodiment may be applied, for example, to a photoelectric conversion device including a photoelectric converter. Hereinafter, the semiconductor device according to the present embodiment will be described by taking a photoelectric conversion device as an example. FIG. 1 is a schematic diagram illustrating a general configuration of the photoelectric conversion device according to the present embodiment. FIG. 2 is an equivalent circuit diagram illustrating a configuration example of a pixel circuit in the photoelectric conversion device according to the present embodiment. FIG. 3 and FIG. 4 are schematic cross-sectional views illustrating a configuration example of the photoelectric conversion device according to the present embodiment. FIG. 5 is a schematic diagram illustrating a configuration example of a connecting portion in the photoelectric conversion device according to the present embodiment.

As illustrated in FIG. 1, the photoelectric conversion device 500 according to the present embodiment is formed by stacking a semiconductor component 100 and a semiconductor component 200 each having a semiconductor integrated circuit. The semiconductor component 100, 200 may have a substantially congruent outer edge shape, but need not necessarily be the same.

The semiconductor component 100 includes, for example, a cell array section 10, a drive circuit section 15, and an interface section 16. The cell array section 10 includes a plurality of cells arranged in a plurality of rows and a plurality of columns. Each of the plurality of cells in the cell array section 10 of this example is a pixel cell including a pixel circuit 1 including a photoelectric converter. However, the cell of the cell array section 10 is not limited to a pixel cell but may be a memory cell. The cell array section 10 including a plurality of pixel cells may be referred to as a pixel array section.

In the cell array section 10, a plurality of pixel circuits 1 each including a photoelectric converter is arranged in a two-dimensional shape over a plurality of rows and a plurality of columns. Each column of the cell array section 10 is provided with at least one signal line 11 connected to the pixel circuits 1 arranged in the corresponding column. Since the signal from each of the pixel circuits 1 is output to the signal line 11, each of the signal lines 11 may be referred to as an output line. Since each of the signal line 11 is arranged in a corresponding column, each of the signal lines 11 may also be referred to as a column line.

The semiconductor component 200 includes, for example, a constant current source circuit section 21, a column circuit section 22, a drive circuit section 25, an interface section 26, an arithmetic circuit section 27, and a control circuit section 28. The constant current source circuit section 21 includes a plurality of constant current sources (current sources 21a, which will be described below) corresponding to each of the signal lines 11. The column circuit section 22 includes a plurality of column circuits (column circuits 22a, which will be described later) corresponding to each of the signal lines 11. Each of the plurality of column circuits is a processing unit which performs predetermined signal processing on the output signal of the pixel circuit 1, for example, correlated double sampling (CDS) processing, amplification processing. AD (Analog-Digital) conversion processing and the like. The arithmetic circuit section 27 has a function of performing predetermined operation processing on the signal output from the column circuit section 22. A circuit of each circuit section of the semiconductor component 200 may be an integrated circuit comprised of MOS transistors.

The drive circuit sections 15, 25 include a drive circuit for driving the pixel circuit 1 on a row basis. The interface sections 16, 26 include an interface circuit for supplying power from outside of the photoelectric conversion device 500, and inputting and outputting signals. The control circuit section 28 has a function of supplying control signals for controlling the operation and timing of the drive circuit sections 15, 25, the column circuit section 22, and the like. At least a portion of the control signal may be supplied from outside the photoelectric conversion device 500.

The photoelectric conversion device 500 further includes a plurality of connecting portions 31, 32, 35, 36, 37 for electrically connecting between the semiconductor component 100 and the semiconductor component 200. FIG. 1 schematically illustrates the connecting portions 31, 32, 35, 36, 37. As illustrated in FIG. 1, among the plurality of connecting portions 31, 32, 35, 36, 37, the connecting portion 31 and the connecting portion 32 are provided at positions overlapping the cell array section 10. Among the plurality of connecting portions 31, 32, 35, 36, 37, the connecting portion 35, the connecting portion 36, and the connecting portion 37 are provided at positions that do not overlap the cell array section 10. That is, the connecting portion 35, the connecting portion 36, and the connecting portion 37 are provided at positions overlapping with portions of the semiconductor component 100 outside the cell array section 10.

Each of the plurality of signal lines 11 is electrically connected to the constant current source circuit section 21 via the connecting portion 31, and to the column circuit section 22 via the connecting portion 32. In other words, each of the plurality of signal lines 11 is electrically connected to a plurality of circuit sections having different functions via separate connecting portions. The constant current source circuit section 21 and the column circuit section 22 are not electrically connected in the semiconductor component 200, but are electrically connected to each other via the signal line 11 of the semiconductor component 100.

The drive circuit section 15 and the drive circuit section 25 are electrically connected to each other via the connecting portions 35, 37. The connecting portion 35 has a function of transmitting signals between the drive circuit sections 15, 25. The connecting portion 37 has a function of supplying power between the drive circuit sections 15, 25. The interface section 16 and the interface section 26 are electrically connected to each other via the connecting portion 36.

In the configuration example illustrated in FIG. 1, each of the constant current source circuit section 21, the column circuit section 22, the arithmetic circuit section 27, and the control circuit section 28 is divided into two blocks to constitute two readout circuits. The signal lines 11 arranged in adjacent columns are connected to different sets of readout circuits. Specifically, the plurality of signal lines 11 includes a first set in which the connecting portion 31 is located on the side in the first direction with respect to the middle row and the connecting portion 32 is located on the side in the second direction opposite to the first direction with respect to the middle row. The plurality of signal lines 11 includes a second set in which the connecting portion 31 is located on the second direction side with respect to the middle row and the connecting portion 32 is located on the first direction side with respect to the middle row. The first set of signal lines 11 are connected to a first block of the constant current source circuit section 21 and a first block of the column circuit section 22. The second set of signal lines 11 is connected to the second block of the constant current source circuit section 21 and the second block of the column circuit section 22. In one example, the first set of signal lines 11 and the second set of signal lines 11 are alternately arranged.

The two blocks of the constant current source circuit section 21 and the two blocks of the column circuit section 22 are arranged in the column direction. Between the first block of the constant current source circuit section 21 and the first block of the column circuit section 22, one of the second block of the constant current source circuit section 21 and the second block of the column circuit section 22 is arranged. FIG. 1 illustrates an example in which the second block of the constant current source circuit section 21 is arranged between the first block of the constant current source circuit section 21 and the first block of the column circuit section 22. Between the first block of the constant current source circuit section 21 and the first block of the column circuit section 22, the second block of the column circuit section 22 may be arranged. Here, the first block of the constant current source circuit section 21 and the first block of the column circuit section 22 belong to one of the two readout circuits, and the second block of the constant current source circuit section 21 and the second block of the column circuit section 22 belong to the other of the two readout circuits.

Further, between the first block of the column circuit section 22 and the second block of the column circuit section 22, the first block of the constant current source circuit section 21 and the second block of the constant current source circuit section 21 are arranged. The first block of the constant current source circuit section 21 and the second block of the constant current source circuit section 21 may be arranged in reverse. Further, between the first block of the arithmetic circuit section 27 and the second block of the arithmetic circuit section 27, the first block of the column circuit section 22 and the second block of the column circuit section 22 are arranged.

Each pixel circuit 1 includes, for example, photoelectric converter PD1, PD2, transfer transistors TX1, TX2, a reset transistor RS, an amplifier transistor SF, a select transistor SL, and a capacitor FD, as illustrated in FIG. 2. Each transistor of the pixel circuit 1 may be a MOS transistor.

The photoelectric converters PD1. PD2 may be a photoelectric conversion element, such as photodiode, photogate, and the like. Here, it is assumed that the photoelectric converter PD1, PD2 are constituted by photodiodes. A photodiode constituting the photoelectric converter PD1 has an anode connected to a ground node and a cathode connected to a source of the transfer transistor TX1. A photodiode constituting the photoelectric converter PD2 has an anode connected to a ground node and a cathode connected to a source of the transfer transistor TX2. A drain of the transfer transistor TX1 and a drain of the transfer transistor TX2 are connected to a source of the reset transistor RS and a gate of the amplifier transistor SF. A connection node between the drain of the transfer transistor TX1, the drain of the transfer transistor TX2, the source of the reset transistor RS, and the gate of the amplifier transistor SF constitutes a floating node FN. The capacitance component coupled to the floating node FN is represented as capacitor FD in FIG. 2. A drain of the reset transistor RS and a drain of the amplifier transistor SF are connected to the power supply line VDD. A source of the amplifier transistor SF is connected to a drain of the select transistor SL. A source of the select transistor SL is connected to the signal line 11.

Each row of the cell array section 10 is provided with at least one signal line (not illustrated) connected to the pixel circuit 1 arranged in the corresponding row. The signal lines (not illustrated) connected to the pixel circuit 1 arranged in the corresponding row is, for example, five signal lines connected to a gate of the transfer transistor TX1, a gate of the transfer transistor TX2, a gate of the reset transistor RS, and a gate of the select transistor SL, respectively. Since the signal to the pixel circuit 1 is input from the signal line, the signal line 11 may be referred to as an input line. Since the input line is arranged in the corresponding row, the input line may also be referred to as a row line. The row line and the column line may include, in addition to the signal lines such as the input lines and the output lines, power supply lines for supplying a ground potential or a drive potential.

A current source 21a is connected to the signal line 11 via the connecting portion 31. A column circuit 22a is connected to the signal line 11 via the connecting portion 32 different from the connecting portion 31. Similar to the signal line 11, the power supply line VDD for supplying the power supply voltage to the reset transistor RS and the amplifier transistor SF may be arranged for each column of the cell array section 10. A common power supply line (not illustrated) for supplying a power supply voltage to these power supply lines may be provided in the semiconductor component 100, but may be provided in the semiconductor component 200. With this configuration, the interconnection length of the power supply line in the semiconductor component 100 may be shortened, and the impedance may be reduced. Similarly, it is also possible to adopt a configuration in which each of a plurality of circuit sections provided in the semiconductor component 200 is electrically connected to an input line via separate connecting portions, thereby reducing impedance. Similarly, it is also possible to adopt a configuration in which each of a plurality of circuit sections provided in the semiconductor component 200 is electrically connected to a power supply line via separate connecting portions, thereby reducing impedance.

The transfer transistors TX1, TX2, the reset transistor RS, the amplifier transistor SF, and the select transistor SL may be constituted of MIS (Metal-Insulator-Semiconductor) transistors. The amplifier transistor SF may be also a junction field effect transistor. In the equivalent circuit of FIG. 2, the photoelectric converters PD1, PD2, the transfer transistors TX1, TX2, and the capacitor FD are illustrated as separate components, but the transfer transistors TX1, TX2 may include the photoelectric converters PD1, PD2 and a part of the capacitor FD. For example, the source of the transfer transistor TX1 may be comprised of an n-type semiconductor region constituting the cathode of the photoelectric converter PD1. The source of the transfer transistor TX2 may be comprised of an n-type semiconductor region constituting the cathode of the photoelectric converter PD2. The drains of the transfer transistors TX1, TX2 may be comprised of an n-type semiconductor region that constitutes a p-n junction capacitor that constitutes at least a part of the capacitor FD. In this case, the gates of the transfer transistors TX1, TX2 may be called transfer electrodes having an MIS gate structure.

Note that the pixel circuit 1 illustrated in FIG. 2 is an example, and is not limited thereto. For example, in the pixel circuit 1 of FIG. 2, two photoelectric converters PD1, PD2 share one amplifier transistor SF, but three or more photoelectric converters may share one amplifier transistor SF. Alternatively, an amplifier transistor SF may be provided for each of the photoelectric converters PD1, PD2. The pixel circuit 1 does not necessarily include a plurality of photoelectric converters, and may include one photoelectric converter.

FIG. 3 is a schematic cross-sectional view illustrating a configuration example of the photoelectric conversion device according to the present embodiment. FIG. 3 is a cross-sectional view of the semiconductor component 100 and the semiconductor component 200 along the extending direction of the signal line 11.

As illustrated in FIG. 3, for example, the semiconductor component 100 may include a semiconductor layer 110 having a first surface 112 and a second surface 114 facing each other, and an interconnection structure 120 arranged over a side of the first surface 112 of the semiconductor layer 110. FIG. 3 illustrates an amplifier transistor SF and a select transistor SL of the pixel circuit 1 as a part of elements provided on the semiconductor layer 110. The interconnection structure 120 includes an insulating layer 122 and a plurality of interconnection layers 124, 126, 128 arranged in the insulating layer 122. These interconnection layers include a signal line 11 electrically connected to the source of the select transistor SL and an electrode 130, 132 electrically connected to the signal line 11. Interconnections of each layer is appropriately connected via contact plugs 134 so as to constitute a predetermined circuit. The electrodes 130, 132 are formed of the uppermost level interconnection layer, and is located on the surface of the semiconductor component 100.

As illustrated in FIG. 3, for example, the semiconductor component 200 may include a semiconductor layer 210 having a first surface 212 and a second surface 214 facing each other, and an interconnection structure 220 arranged over a side of the first surface 212 of the semiconductor layer 210. FIG. 3 illustrates, as a part of elements provided in the semiconductor layer 210, transistors M11, M12 constituting the constant current source circuit section 21 and transistors M21, M22 constituting the column circuit section 22. The interconnection structure 220 includes an insulating layer 222 and a plurality of interconnection layers 224, 226, 228 arranged in the insulating layer 222. These interconnection layers include electrodes 230, 232 electrically connected to the transistors M11, M21. Interconnections of each layer is appropriately connected via contact plugs 234 so as to constitute a predetermined circuit. The electrodes 230, 232 is formed of the uppermost level interconnection layer, and is located on the surface of the semiconductor component 200.

The semiconductor component 100 and the semiconductor component 200 are stacked so that the side of the first surface 112 of the semiconductor layer 110 faces the side of the first surface 212 of the semiconductor layer 210. The electrode 130 and the electrode 230 are electrically connected at a bonding surface between the semiconductor component 100 and the semiconductor component 200, and constitute the connecting portion 31. The electrode 132 and the electrode 232 are electrically connected to each other at the bonding surface between the semiconductor component 100 and the semiconductor component 200 to constitute the connecting portion 32. Thus, the signal line 11 is connected to the current source (CS) 21a via the connecting portion 31, and to the column circuit (CLMC) 22a via the connecting portion 32. Typically, the electrode 130 and the electrode 230 constituting the connecting portion 31 are made of a metal, such as copper, gold, and the like, and the metal forming the electrode 130 and the metal forming the electrode 230 are directly metallic bonded. On the bonding surface between the semiconductor component 100 and the semiconductor component 200, the insulating layer 122 and the insulating layer 222 may be covalently bonded directly. Alternatively, the electrode 130 and the electrode 230 are electrically connected via a conductive member, such as solder, and the like, whereby the connecting portion 31 may be constituted by the electrode 130, the electrode 230, and the conductive member. In this case, since the insulating layer 122 and the insulating layer 222 may be separated from each other, a resin material (underfill) may be provided between the insulating layer 122 and the insulating layer 222. Other connecting portions represented by the connecting portion 32 may have the same configuration as that of the connecting portion 31. An optical component (not illustrated), such as a color filter, a micro lens, and the like may be arranged over the side of the second surface 114 of the semiconductor layer 110.

The configuration example illustrated in FIG. 3 is a backside illumination-type photoelectric conversion device 500 for receiving light incident from the side of the second surface 114 of the semiconductor layer 110.

FIG. 4 is a schematic cross-sectional view illustrating another configuration example of the photoelectric conversion device according to the present embodiment. FIG. 4 is a cross-sectional view of the semiconductor component 100 and the semiconductor component 200 along the extending direction of the signal line 11.

The configuration example illustrated in FIG. 4 is different from the configuration example illustrated in FIG. 3 in that it is a frontside illumination-type photoelectric conversion device 500 for receiving light incident from the side of the first surface 112 of the semiconductor layer 110.

As illustrated in FIG. 4, for example, the semiconductor component 100 may include a semiconductor layer 110 having a first surface 112 and a second surface 114 facing each other, and an interconnection structure 120 arranged over the side of the first surface 112 of the semiconductor layer 110. The interconnection structure 120 includes an insulating layer 122 and a plurality of interconnection layers 124, 126 arranged in the insulating layer 122. These interconnection layers include a signal line 11 electrically connected to the source of the select transistor SL and electrodes 135, 136 electrically connected to the signal line 11. The interconnections of each layer is appropriately connected via contact plugs 134 so as to constitute a predetermined circuit. The semiconductor component 100 further includes through electrodes 138, 140 that penetrate a part of the semiconductor layer 110 and the insulating layer 122 from the side of the second surface 114 of the semiconductor layer 110 and reaches the electrode 135, 136. The semiconductor component 200 is similar to the configuration example of FIG. 3.

The semiconductor component 100 and the semiconductor component 200 are stacked so that the side of the second surface 114 of the semiconductor layer 110 faces the side of the first surface 212 of the semiconductor layer 210. The through electrode 138 and the electrode 230 are electrically connected to each other at a bonding surface between the semiconductor component 100 and the semiconductor component 200, and constitute the connecting portion 31. Further, the through electrode 140 and the electrode 232 are electrically connected to each other at the bonding surface between the semiconductor component 100 and the semiconductor component 200, and constitute the connecting portion 32. Thus, the signal line 11 is connected to the current source 21a via the connecting portion 31, and is connected to the column circuit 22a via the connecting portion 32. Optical components (not illustrated), such as color filters, micro lenses, and the like, are disposed above the interconnection structure 120 (opposite side of the semiconductor layer 110).

Other connecting portions 35, 36, 37 not illustrated in FIG. 3 and FIG. 4 may be configured in the same manner as the connecting portions 31, 32.

Although FIG. 3 and FIG. 4 illustrates the interconnection structures 120, 220 comprised of three interconnection layers, the total number of interconnection layers constituting the interconnection structures 120, 220 is not limited to three, and may be appropriately increased or decreased. The interconnection layer in which the signal line 11 is formed does not necessarily have to be the second-level interconnection layer.

Next, an outline of the operation of the photoelectric conversion device 500 according to the present embodiment will be described with reference to FIG. 1 and FIG. 2.

The photoelectric converters PD1, PD2 convert (photoelectrically convert) the incident light into an amount of charge in accordance with the light amount thereof and accumulates generated charge. When turned on, the transfer transistor TX1 transfers the charge held in the photoelectric converter PD1 to the floating node FN. When turned on, the transfer transistor TX2 transfers the charge held in the photoelectric converter PD2 to the floating node FN. The capacitor FD holds the charge transferred to the floating node FN and sets the potential of the floating node FN to a potential corresponding to the amount of charge by charge-voltage conversion in accordance with the capacitance thereof. The amplifier transistor SF is configured such that the power supply voltage is supplied to the drain and bias current is supplied to the source from a current source 21a via the connecting portion 31, the signal line 11, and the select transistor SL, and constitutes a source follower circuit (amplifier unit) having the gate as an input node. Thus, the amplifier transistor SF outputs a signal based on the potential of the floating node FN to the signal line 11 via the select transistor SL. When turned on, the reset transistor RS resets the floating node FN to a potential corresponding to the power supply voltage. The select transistor SL switches the connection between the amplifier transistor SF and the signal line 11.

The pixel signal, which is an analog signal outputted from the pixel circuit 1, is input to the column circuit 22a via the signal line 11 and the connecting portion 32. The column circuit 22a performs predetermined processing, such as CDS processing, amplification processing, AD conversion processing, and the like on the pixel signal, and converts the pixel signal into digital data. The digital data output from the column circuit 22a is input to the arithmetic circuit section 27. The arithmetic circuit section 27 performs predetermined arithmetic processing on the digital data output from the column circuit 22a The digital signal output from the arithmetic circuit section 27 is converted into a signal suitable for differential transmission, such as LVDS, and the like and is output to the outside of the photoelectric conversion device 500 by the interface section 16.

Next, the effects achieved by the photoelectric conversion device 500 according to the present embodiment will be described with reference to FIG. 5. FIG. 5 illustrates detailed connections between the signal line 11 and the current source 21a, and between the signal line 11 and the column circuit 22a. Here, as illustrated in FIG. 5, among the rows in which the pixel circuit 1 is arranged, a row region PIXROWS1 is defined as a portion from one end to the connecting portion 31, a row region PIXROWS2 is defined as a portion from the connecting portion 31 to the connecting portion 32, and a row region PIXROWS3 is defined as a portion from the connecting portion 32 to the other end. Note that the middle row of the cell array section 10 is arranged in the row area PIXROWS2. That is, the pixel circuit 1 arranged in the middle row is connected to the signal line 11 at the electrical path between the connecting portion 31 and the connecting portion 32.

As illustrated in FIG. 5, the connecting portion 31 connecting the signal line 11 and the current source 21a has a parasitic element 38. The parasitic element 38 includes a parasitic resistor PRJ1 and a parasitic capacitor PCJ1. The connecting portion 32 connecting the signal line 11 and the column circuit 22a has a parasitic element 39. The parasitic element 39 includes a parasitic resistor PRJ2 and a parasitic capacitor PCJ2.

When the pixel signal of the pixel circuit 1 of each row is read out to the column circuit 22a, a current flows from the power supply line VDD to the current source 21a via the amplifier transistor SF, the select transistor SL, and the signal line 11. If the input impedance of the column circuit 22a is sufficiently large (infinity), no current flows via the parasitic resistor PRJ2, so that no voltage drop occurs due to the parasitic resistor PRJ2. On the other hand, although there is a voltage drop due to the parasitic resistor PRJ1, this voltage drop does not affect the pixel signal read out to the input terminal of the column circuit 22a within the range of maintaining the circuit range of the current source 21a. Similarly, although the signal line 11 has a finite parasitic resistor (not illustrated), the parasitic resistor of the row region PIXROWS2 does not affect the pixel signal read out to the input terminal of the column circuit 22a in a range that maintains the circuit range of the current source 21a. Therefore, the parasitic resistors present in the connecting portions 31, 32 do not affect the pixel signal read out to the input terminal of the column circuit 22a regardless of the position of the selected row. Thus, the pixel signal shading due to the parasitic resistor present in the connecting portions 31, 32 may be improved. Further, the pixel signal shading may also be improved between the connecting portion 31 and the connecting portion 32. The input stage of the column circuit 22a is provided with an operational amplifier and a comparator having a large input impedance. The operational amplifier is used for amplification processing and the comparator is used for AD conversion processing. In particular, since the AD conversion process is important for improving the performance of the semiconductor device, the present embodiment is advantageous when the column circuit section 22 performs the AD conversion process.

In the present embodiment, the three row regions PIXROWS1, PIXROWS2, PIXROWS3 defined by the connecting portions 31, 32 are illustrated, but the connecting portions 31, 32 may be provided at both ends of the signal line 11 so that the row regions PIXROWS1, PIXROWS3 do not exist.

In the configuration example illustrated in FIG. 1, as described above, the constant current source circuit section 21, the column circuit section 22, the arithmetic circuit section 27, and the control circuit section 28 are divided into two blocks to form two sets of readout circuits, and the signal lines 11 arranged in adjacent columns are connected to different sets of readout circuits. Between the first block of the constant current source circuit section 21 and the first block of the column circuit section 22, one of the second block of the constant current source circuit section 21 and the second block of the column circuit section 22 is arranged. With this configuration, the number of rows belonging to the row region PIXROWS2 is increased as compared with the case where the blocks of the constant current source circuit section 21 and the blocks of the column circuit section 22 constituting one readout circuit are arranged adjacently. Thus, the pixel signal shading may be further reduced.

For the connecting portions 31, 32, the optimum arrangement place may be appropriately selected, for example, so that the sum of the capacitances of the parasitic capacitors PCJ1, PCJ2 is minimized, or so that the layout is suitable for the functional block of the semiconductor component 200.

As described above, according to the present embodiment, in the semiconductor device formed by stacking a plurality of semiconductor components, it is possible to suppress the influence of the parasitic elements present at the connecting portions between the semiconductor components and improve the element characteristics.

Second Embodiment

Figure 6:
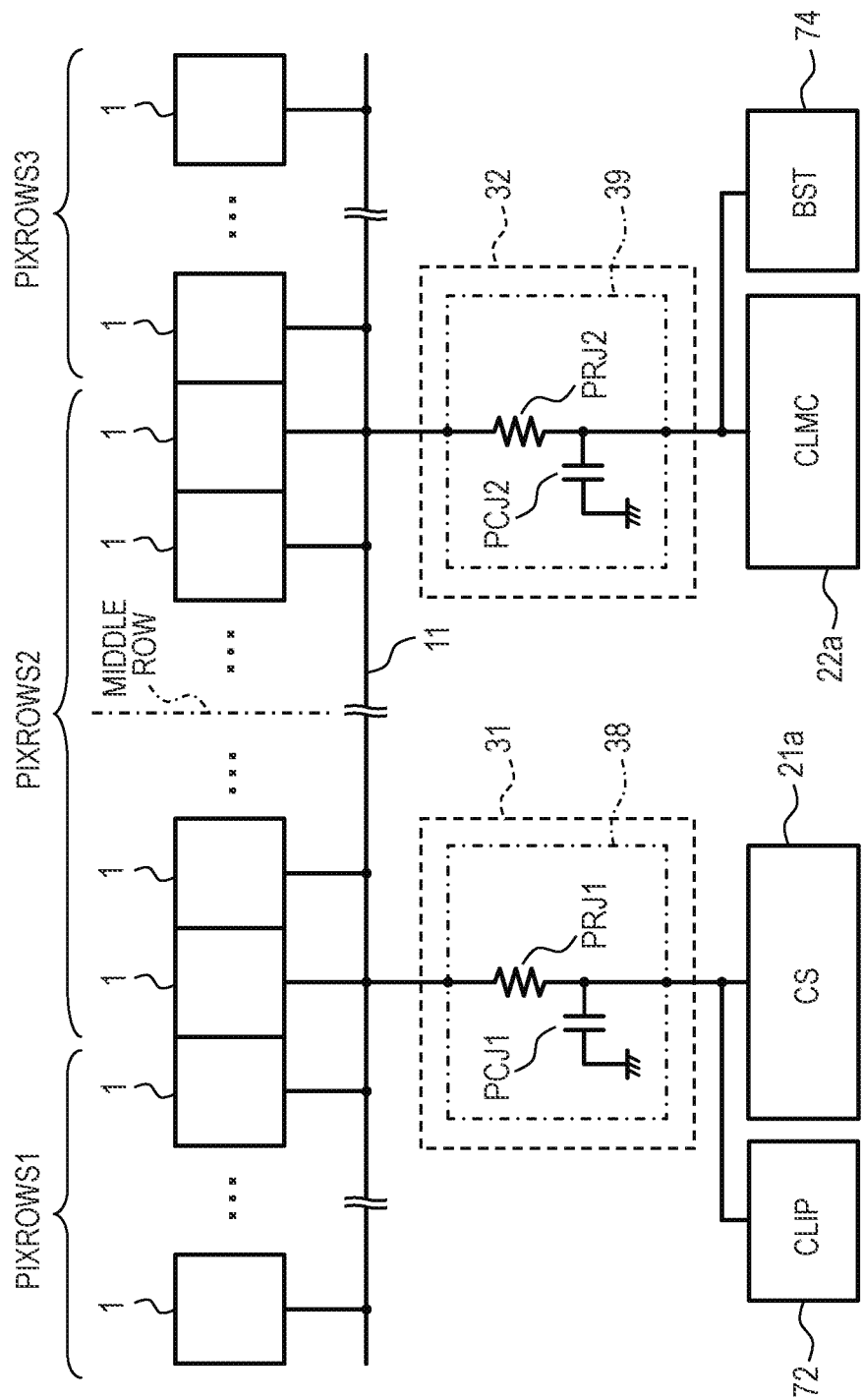
FIG. 6 is a schematic diagram illustrating a configuration example of a connecting portion in a photoelectric conversion device according to a second embodiment of the present invention.

A semiconductor device according to a second embodiment of the present invention will be described with reference to FIG. 6, taking a photoelectric conversion device as an example. FIG. 6 is a schematic diagram illustrating a configuration example of a connecting portion in the photoelectric conversion device according to the present embodiment. The same components as those of the photoelectric conversion device according to the first embodiment are denoted by the same reference numerals, and description thereof will be omitted or simplified.

The photoelectric conversion device according to the present embodiment is the same as the photoelectric conversion device according to the first embodiment except that the configurations of the connecting portions 31, 32 are different. That is, as illustrated in FIG. 6, the photoelectric conversion device according to the present embodiment further includes a clip circuit (CLIP) 72 connected to the connecting portion 31, and a boost circuit (BST) 74 connected to the connecting portion 32.

The clip circuit 72 is a circuit which operates so as to limit the signal amplitude to a predetermined range, and has a role of suppressing a phenomenon called smear or black sinking caused by a rapid change in the potential of the signal line 11 due to the incidence of strong light.

The boost circuit 74 is a circuit for assisting the signal response of the signal line 11. The boost circuit 74 is not particularly limited, and for example, a switch circuit configured to connect the connecting portion 32 to a node of an arbitrary potential, and a pulse drivable current source connected to the connecting portion 32, which is different from the current source 21a, may be applied.

The characteristics of the photoelectric conversion device may be further improved by connecting the signal line 11 with a circuit for assisting the characteristics such as the clip circuit 72 and the boost circuit 74.

In the present embodiment, the clip circuit 72 is connected to the connecting portion 31, and the boost circuit 74 is connected to the connecting portion 32. However, the boost circuit 74 may be connected to the connecting portion 31, and the clip circuit 72 may be connected to the connecting portion 32. In addition to the connecting portions 31, 32, another connecting portion connected to the signal line 11 may be provided, and the clip circuit 72 and the boost circuit 74 may be connected to this connecting portion.

As described above, according to the present embodiment, in the semiconductor device formed by stacking a plurality of semiconductor components, it is possible to suppress the influence of the parasitic elements present at the connecting portions between the semiconductor components and improve the element characteristics.

Third Embodiment

Figure 7:
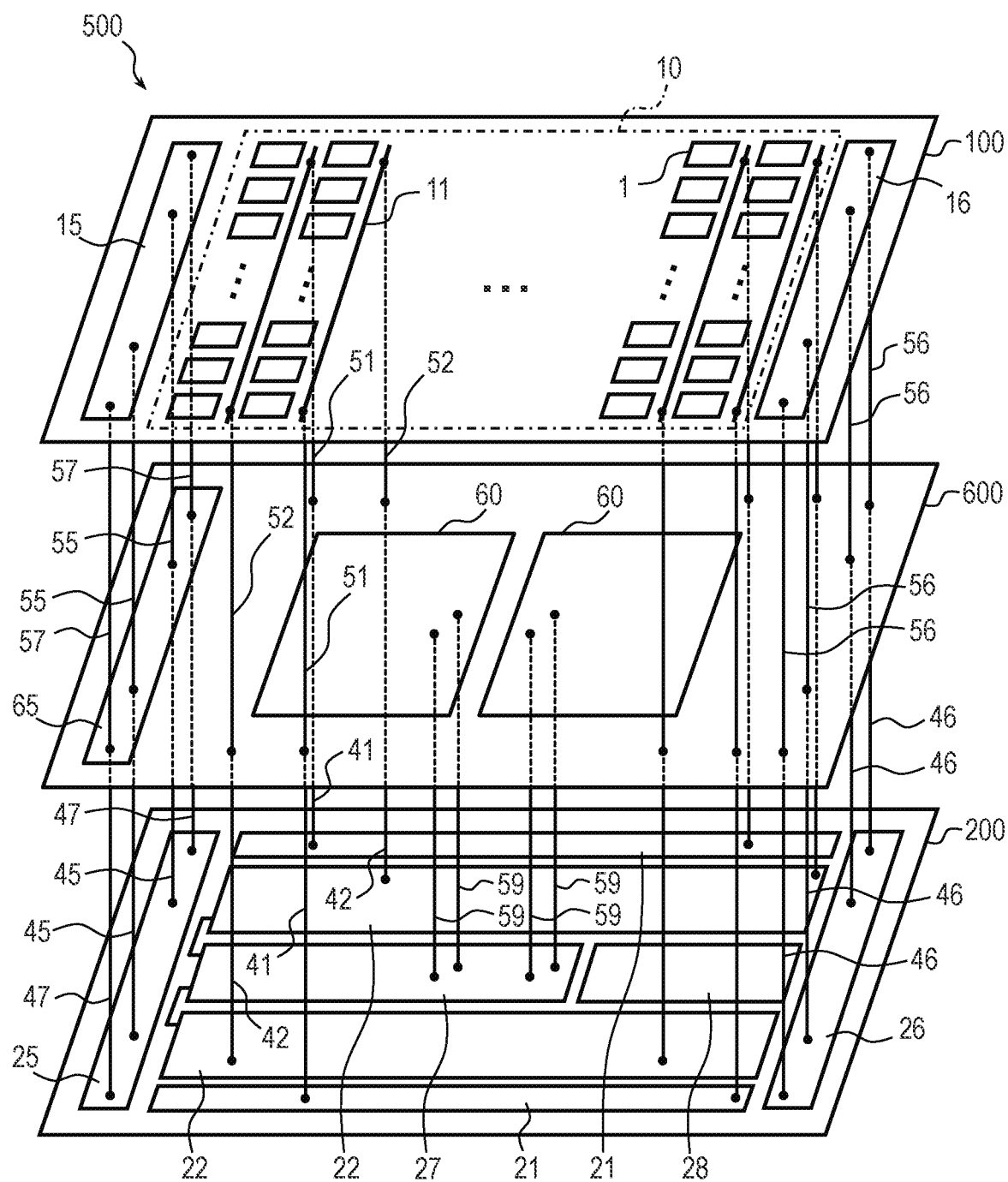
FIG. 7 is a schematic diagram illustrating a general configuration of a photoelectric conversion device according to a third embodiment of the present invention.
Figure 8:
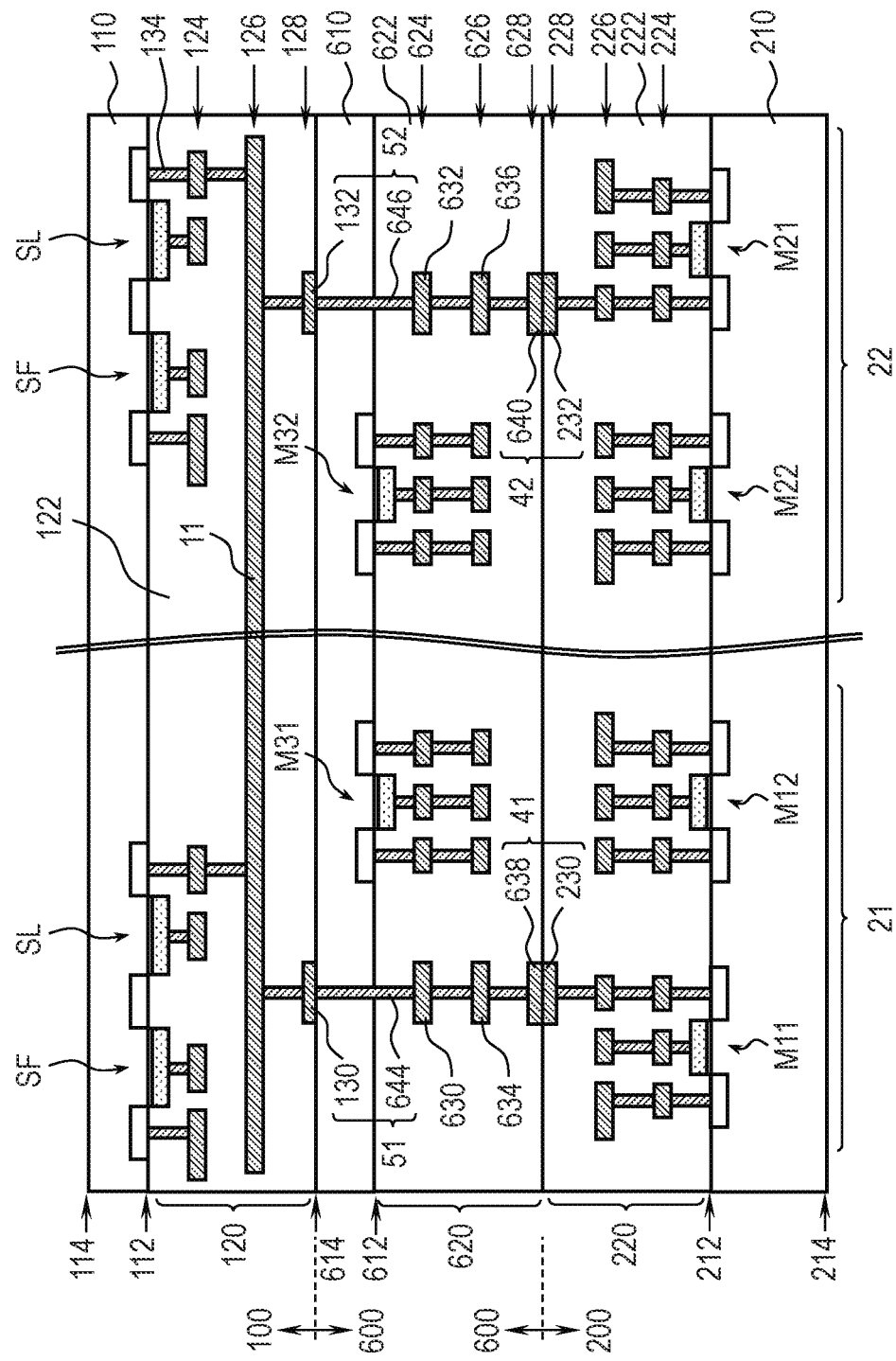
FIG. 8 is a schematic cross-sectional view illustrating a configuration example of the photoelectric conversion device according to the third embodiment of the present invention.

A semiconductor device according to a third embodiment of the present invention will be described with reference to FIG. 7 and FIG. 8, taking a photoelectric conversion device as an example. FIG. 7 is a schematic diagram illustrating a schematic configuration of a photoelectric conversion device according to the present embodiment. FIG. 8 is a schematic cross-sectional view illustrating a configuration example of the photoelectric conversion device according to the present embodiment. The same components as those of the photoelectric conversion devices according to the first and second embodiments are denoted by the same reference numerals, and the description thereof is omitted or simplified.

In the first embodiment, the photoelectric conversion device 500 formed by stacking the semiconductor component 100 and the semiconductor component 200 has been described, but it is also possible to constitute the photoelectric conversion device by stacking three or more semiconductor components. In the present embodiment, an example of a photoelectric conversion device formed by stacking three or more semiconductor components will be described.

As illustrated in FIG. 7, the photoelectric conversion device 500 according to the present embodiment comprises a semiconductor component 100, a semiconductor component 600, and a semiconductor component 200 stacked in this order. The semiconductor components 100, 600, 200 may have a substantially congruent outer edge shape, but need not necessarily be the same.

The basic configurations of the semiconductor component 100 and the semiconductor component 200 are the same as those of the first embodiment. The semiconductor component 600 is provided with a storage circuit section 60 and a drive circuit section 65. It should be noted that at least a part of the functional blocks arranged in the semiconductor component 600 and at least a part of the functional blocks arranged in the semiconductor component 200 may be replaced. For example, the semiconductor component 200 may be provided with the storage circuit section 60, and the semiconductor component 600 may be provided with the arithmetic circuit section 27.

The photoelectric conversion device 500 further includes a plurality of connecting portions 41, 42, 45, 46, 47, 51, 52, 55, 56, 57, 59 for electrically connecting at least two of the semiconductor components 100, 600, 200. FIG. 7 schematically illustrates the connecting portions 41, 42, 45, 46, 47, 51, 52, 55, 56, 57, 59. A part of these connecting portions 41, 42, 45, 46, 47, 51, 52, 55, 56, 57, 59 is a through electrode penetrating the semiconductor layer of the semiconductor component 100 and/or the semiconductor component 600. Since these semiconductor layers are typically silicon layers (single crystalline silicon layer), such through electrodes are sometimes referred to as TSVs (through-silicon vias). The through electrode and the semiconductor element provided in the semiconductor component 100, 600 are insulated from each other by an insulator (not illustrated) provided on the side wall of the through hole in which the through electrode is provided, and an isolation groove (not illustrated) provided in the semiconductor layer.

Each of the plurality of signal lines 11 is electrically connected to the constant current source circuit section 21 via the connecting portions 51, 41, and to the column circuit section 22 via the connecting portions 52, 42. The constant current source circuit section 21 and the column circuit section 22 are not electrically connected in the semiconductor components 200, 600, but are electrically connected to each other via the signal line 11 of the semiconductor component 100.

The drive circuit section 15 and the drive circuit section 65 are electrically connected to each other via the connecting portions 55, 57. The drive circuit section 65 and the drive circuit section 25 are electrically connected to each other via the connecting portions 45, 47. The connecting portion 45 has a function of transmitting signals between the drive circuit sections 25 and 65. The connecting portion 55 has a function of transmitting signals between the drive circuit sections 65, 15. The connecting portion 47 has a function of supplying power between the drive circuit sections 25, 65. The connecting portion 57 has a function of supplying power between the drive circuit sections 65, 15. The interface section 16 and the interface section 26 are electrically connected to each other via the connecting portions 46, 56.

FIG. 8 is a schematic cross-sectional view illustrating a configuration example of the photoelectric conversion device according to the present embodiment. FIG. 8 is a cross-sectional view of the semiconductor components 100, 600, 200 along the extending direction of the signal lines 11.

The configurations of the semiconductor component 100 and the semiconductor component 200 are the same as those of the first embodiment illustrated in FIG. 3.

As illustrated in FIG. 8, for example, the semiconductor component 600 may include a semiconductor layer 610 having a first surface 612 and a second surface 614 opposed to each other, and an interconnection structure 620 arranged on the side of the first surface 612 of the semiconductor layer 610. FIG. 8 illustrates transistors M31, M32 arranged in the storage circuit section 60 as a part of elements provided in the semiconductor layer 610. The interconnection structure 620 includes an insulating layer 622 and a plurality of interconnection layers 624, 626, 628 arranged in the insulating layer 622. These interconnection layers include interconnections 630, 632, 634, 636 and electrodes 638, 640. The interconnections of each layer is appropriately connected via contact plugs 642 so as to constitute a predetermined circuit. The electrodes 638, 640 are formed of the uppermost-level interconnection layer, and is located on the surface of the semiconductor component 600. The semiconductor component 600 further includes a through electrodes 644, 646 that penetrate parts of the semiconductor layer 610 and the insulating layer 622 from the side of the second surface 614 of the semiconductor layer 610 and reaches the interconnections 630, 632.

The semiconductor component 100 and the semiconductor component 600 are stacked so that the side of the first surface 112 of the semiconductor layer 110 faces the side of the second surface 614 of the semiconductor layer 610. The electrode 130 and the through electrode 644 are electrically connected to each other at a bonding surface between the semiconductor component 100 and the semiconductor component 600 to form the connecting portion 51. The electrode 132 and the through electrode 646 are electrically connected to each other on the bonding surface between the semiconductor component 100 and the semiconductor component 600 to form the connecting portion 52. An optical component (not illustrated) such as a color filter, a micro lens, and the like is arranged over the side of the semiconductor layer 110 on the second surface 114.

The semiconductor component 600 and the semiconductor component 200 are stacked so that the side of the first surface 612 of the semiconductor layer 610 faces the side of the first surface 212 of the semiconductor layer 210. The electrode 638 and the electrode 230 are electrically connected at a bonding surface between the semiconductor component 600 and the semiconductor component 200 to form the connecting portion 41. The electrode 640 and the electrode 232 are electrically connected to each other on the bonding surface between the semiconductor component 600 and the semiconductor component 200 to form the connecting portion 42.

As a result, the signal line 11 is connected to the current source (CS) 21a via the connecting portions 51, 41, and to the column circuit (CLMC) 22a via the connecting portions 52, 42. The connecting portions 51, 41 and the connecting portions 52, 42 have electrical paths to electrically connect the semiconductor component 100 and the semiconductor component 200 via the semiconductor component 600.

In the present embodiment, since the photoelectric conversion device is constituted by stacking three semiconductor components, the interconnections are longer than in the first embodiment, and the parasitic capacitors to be added tends to be larger. However, by providing the signal line 11 with a plurality of connecting portions and individually connecting the constant current source circuit section 21 and the column circuit section 22 having different functions, the characteristics may be improved.

As described above, according to the present embodiment, in the semiconductor device formed by stacking a plurality of semiconductor components, it is possible to suppress the influence of the parasitic elements present at the connecting portions between the semiconductor components and improve the element characteristics.

Fourth Embodiment

Figure 9:
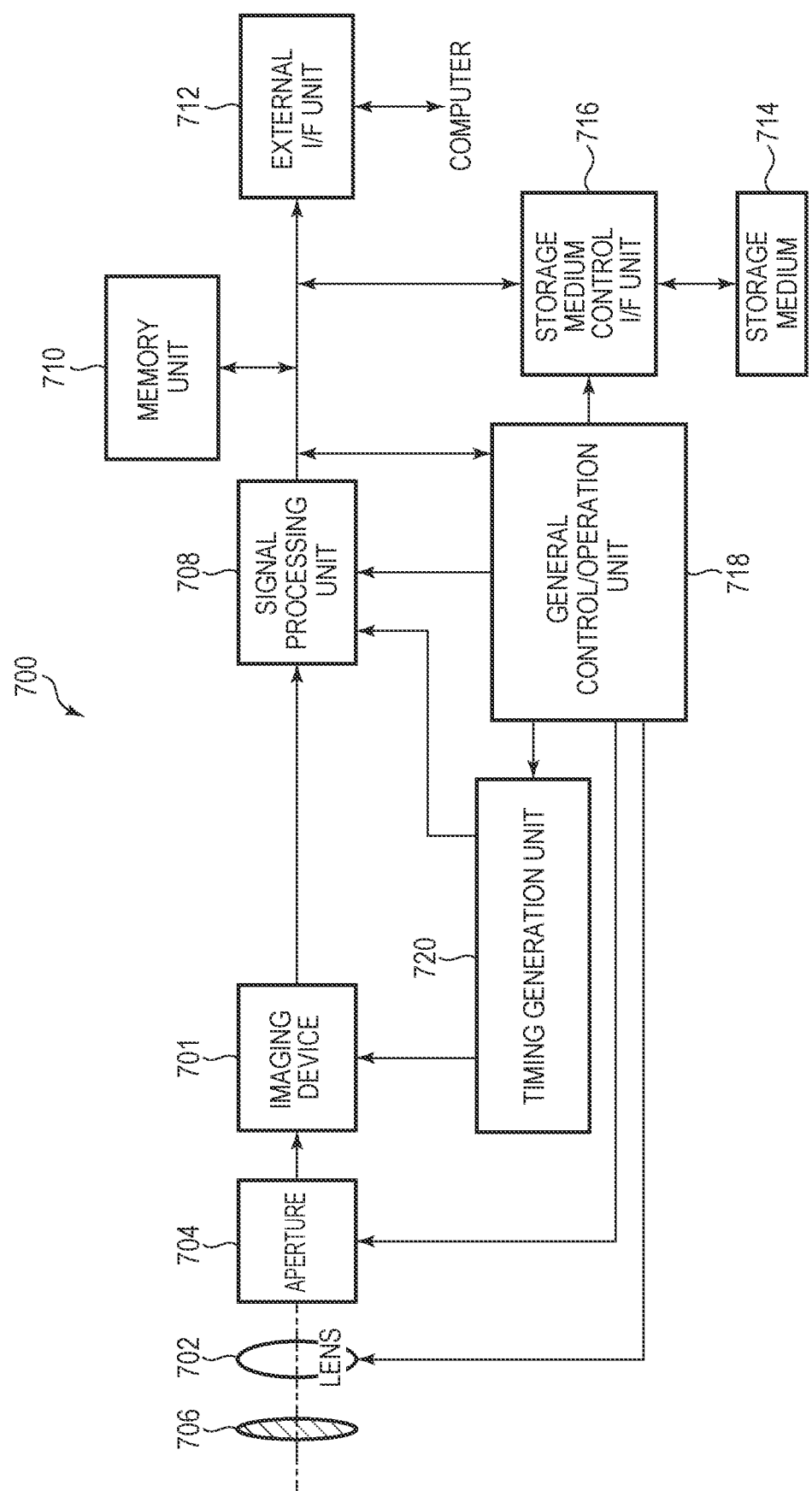
FIG. 9 is a block diagram illustrating a general configuration of an imaging system according to a fourth embodiment of the present invention.

An imaging system according to a fourth embodiment of the present invention will be described with reference to FIG. 9. FIG. 9 is a block diagram illustrating a general configuration of the imaging system according to the present embodiment.

The photoelectric conversion device 500 described in the above first to third embodiments can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 9 illustrates a block diagram of a digital still camera as an example out of these examples.

An imaging system 700 illustrated as an example in FIG. 9 includes an imaging device 701, a lens 702 that captures an optical image of a subject onto the imaging device 701, an aperture 704 for changing a light amount passing through the lens 702, and a barrier 706 for protecting the lens 702. The lens 702 and the aperture 704 form an optical system that collects a light onto the imaging device 701. The imaging device 701 is the photoelectric conversion device 500 described in any of the first to third embodiments and converts an optical image captured by the lens 702 into image data.

Further, the imaging system 700 includes a signal processing unit 708 that processes a signal output from the imaging device 701. The signal processing unit 708 generates image data from digital signals output by the imaging device 701. Further, the signal processing unit 708 performs operations of performing various correction or compression to output image data, if necessary. The imaging device 701 may include an AD conversion unit that generates a digital signal processed in the signal processing unit 708. The AD conversion unit may be formed in a semiconductor layer (a semiconductor substrate) in which the photoelectric converter of the imaging device 701 is formed or may be formed on a different semiconductor substrate from the semiconductor layer in which the photoelectric converter of the imaging device 701 is formed. Further, the signal processing unit 708 may be formed on the same semiconductor substrate as the imaging device 701.

Furthermore, the imaging system 700 includes a memory unit 710 for temporarily storing image data therein and an external interface unit (external I/F unit) 712 for communicating with an external computer or the like. The imaging system 700 further includes a storage medium 714 such as a semiconductor memory for performing storage or readout of imaging data and a storage medium control interface unit (storage medium control I/F unit) 716 for performing storage or readout on the storage medium 714. Note that the storage medium 714 may be embedded in the imaging system 700 or may be removable.

Furthermore, the imaging system 700 includes a general control/operation unit 718 that performs various calculation and controls the entire digital still camera and a timing generation unit 720 that outputs various timing signals to the imaging device 701 and the signal processing unit 708. Here, the timing signal or the like may be input from the outside, and the imaging system 700 may include at least the imaging device 701 and the signal processing unit 708 that processes an output signal output from the imaging device 701.

The imaging device 701 outputs an imaging signal to the signal processing unit 708. The signal processing unit 708 performs predetermined signal processing on an imaging signal output from the imaging device 701 and outputs image data. The signal processing unit 708 uses an imaging signal to generate an image.

As described above, according to the present embodiment, the imaging system to which the photoelectric conversion device 500 according to any of the first to third embodiments is applied can be realized.

Fifth Embodiment

Figure 10A:
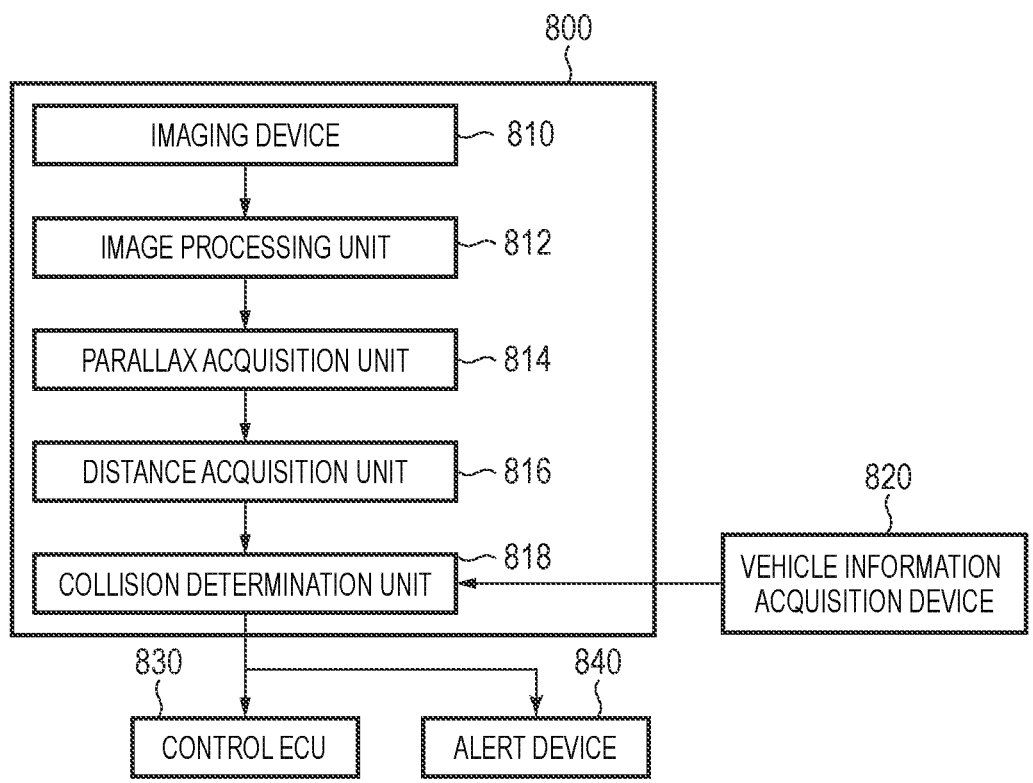
FIG. 10A is a diagram illustrating a configuration example of an imaging system according to a fifth embodiment of the present invention.
Figure 10B:
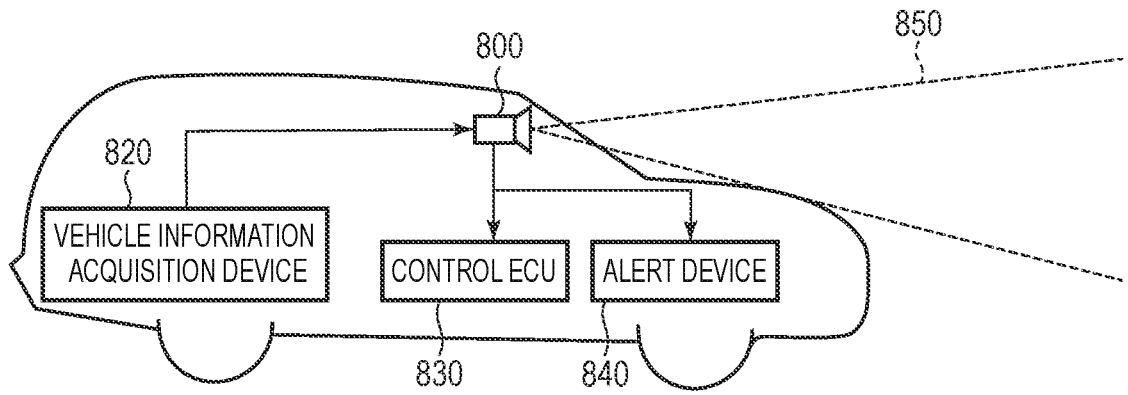
FIG. 10B is a diagram illustrating a configuration example of a movable object according to the fifth embodiment of the present invention.

An imaging system and a movable object according to a fifth embodiment of the present invention will be described with reference to FIG. 10A and FIG. 10B. FIG. 10A is a diagram illustrating a configuration of the imaging system according to the present embodiment. FIG. 10B is a diagram illustrating a configuration of the movable object according to the present embodiment.

FIG. 10A illustrates an example of an imaging system related to an on-vehicle camera. An imaging system 800 includes an imaging device 810. The imaging device 810 is the photoelectric conversion device 500 described in any of the above first to third embodiments. The imaging system 800 includes an image processing unit 812 that performs image processing on a plurality of image data acquired by the imaging device 810 and a parallax acquisition unit 814 that calculates a parallax (a phase difference of parallax images) from the plurality of image data acquired by the imaging system 800. Further, the imaging system 800 includes a distance acquisition unit 816 that calculates a distance to the object based on the calculated parallax and a collision determination unit 818 that determines whether or not there is a collision possibility based on the calculated distance. Here, the parallax acquisition unit 814 and the distance acquisition unit 816 are an example of a distance information acquisition unit that acquires distance information on the distance to the object. That is, the distance information is information on a parallax, a defocus amount, a distance to an object, or the like. The collision determination unit 818 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 800 is connected to the vehicle information acquisition device 820 and can acquire vehicle information such as a vehicle speed, a yaw rate, a steering angle, or the like. Further, the imaging system 800 is connected to a control ECU 830, which is a control device that outputs a control signal for causing a vehicle to generate braking force based on a determination result by the collision determination unit 818. Further, the imaging system 800 is also connected to an alert device 840 that issues an alert to the driver based on a determination result by the collision determination unit 818. For example, when the collision probability is high as the determination result of the collision determination unit 818, the control ECU 830 performs vehicle control to avoid a collision or reduce damage by applying a brake, pushing back an accelerator, suppressing engine power, or the like. The alert device 840 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 800. FIG. 10B illustrates the imaging system when a front area of a vehicle (a capturing area 850) is captured. The vehicle information acquisition device 820 transmits an instruction to the imaging system 800 or the imaging device 810. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

The photoelectric conversion devices described in the first to third embodiments may be configured as a device for acquiring an image, that is, as an imaging device. Further, in the case where the present invention is applied to, for example, the device mainly intended for distance measurement as described in the fifth embodiment, it is not always necessary to output an image. In such a case, the apparatus may be referred to as a photoelectric conversion device for converting optical information into a predetermined electric signal. The imaging device is one of the photoelectric conversion devices.

Further, the imaging systems illustrated in the above fourth and fifth embodiments are examples of an imaging system to which the photoelectric conversion device of the present invention may be applied, and an imaging system to which the photoelectric conversion device of the present invention can be applied is not limited to the configuration illustrated in FIG. 9 and FIG. 10A.

It should be noted that the above embodiments are only examples of embodiments of the present invention, and the technical scope of the present invention should not be limited by them. That is, the present invention can be practiced in a variety of ways without departing from its technical idea or its principal features.

For example, the semiconductor device according to the present invention is not limited to the imaging device, and may be applied to a variety of semiconductor devices such as a display device, an arithmetic operation device, and a storage device, and may be applied to a variety of equipment. For example, the semiconductor device of the present invention can be applied to electronic equipment such as cameras, portable terminals, general-purpose computers, transportation equipment, such as automobiles, ships, airplanes, and the like, communication equipment, office equipment, such as copiers, printers, scanners, and the like, and display equipment, such as displays, and the like. In addition, the semiconductor device according to the present invention may be widely applied to industrial equipment, such as medical equipment, such as X-ray diagnostic devices, endoscopes, and the like, analytical devices, and semiconductor manufacturing equipment, and the like. Further, the device which may be connected to the semiconductor device of the above embodiments may include control devices, such as an image processing device including an arithmetic circuit, a power supply controller, a motor controller, a robot controller, and the like. The device which may be connected to the semiconductor device of the above embodiments may further include a semiconductor memory, a magnetic recording medium, a storage device using an optical recording medium, a liquid crystal display, a display device such as an OLED (organic light emitting diode) display, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-037964, filed Mar. 5, 2020 which is hereby incorporated by reference herein in its entirety.

What is claimed is:

1. A semiconductor device comprising:
   a first semiconductor component including a first circuit section and an interconnection connected to the first circuit section; and
   a second semiconductor component including a second circuit section and a third circuit section and stacked on the first semiconductor component,
   wherein the first circuit section is a cell array section including a plurality of cells arranged to form a plurality of rows and a plurality of columns,
   wherein each of the plurality of cells includes a pixel circuit including a photoelectric converter and an amplifier unit,
   wherein the interconnection is a plurality of signal lines arranged in at least one of each of the plurality of rows or each of the plurality of columns, and each of the plurality of signal lines is connected to corresponding cells,
   wherein the interconnection is electrically connected to a first connecting portion and a second connecting portion of a plurality of connecting portions for electrically connecting the first semiconductor component and the second semiconductor component,
   wherein the second circuit section includes a current source for supplying a bias current to the amplifier unit,
   wherein the second circuit section is electrically connected to the interconnection via the first connecting portion,
   wherein the third circuit section includes a processing unit for processing a signal output from the pixel circuit,
   wherein the third circuit section is electrically connected to the interconnection via the second connecting portion,
   wherein the cell arranged in a middle row of the plurality of rows is connected to the interconnection in an electrical path between the first connecting portion and the second connecting portion, and
   wherein no electrical paths for connecting the first connecting portion and the second connecting portion are provided on the second semiconductor component.

2. The semiconductor device according to claim 1,
   wherein each of the second circuit section and the third circuit section is divided into two blocks,
   wherein a first block and a second block of the second circuit section and a first block and a second block of the third circuit section are arranged in a column direction, and
   wherein one of the second block of the second circuit section and the second block of the third circuit section is arranged between the first block of the second circuit section and the first block of the third circuit section.

3. The semiconductor device according to claim 2,
   wherein the plurality of signal lines includes a first set in which the first connecting portion is located on a side in a first direction with respect to the middle row of the plurality of rows and the second connecting portion is located on aside in a second direction opposite to the first direction with respect to the middle row, and a second set in which the first connecting portion is located on the side in the second direction with respect to the middle row and the second connecting portion is located on the side in the first direction with respect to the middle row;
   wherein the signal lines of the first set are connected to the first block of the second circuit section and the first block of the third circuit section, and
   wherein the signal lines of the second set are connected to the second block of the second circuit section and the second block of the third circuit section.

4. The semiconductor device according to claim 3, wherein the first set of signal lines and the second set of signal lines are alternately arranged.

5. The semiconductor device according to claim 1,
   wherein each of the second circuit section and the third circuit section is divided into two blocks,
   wherein a first block and a second block of the second circuit section and a first block and a second block of the third circuit section are arranged in a column direction, and
   the first block of the second circuit section and the second block of the second circuit section are arranged between the first block of the third circuit section and the second block of the third circuit section.

6. The semiconductor device according to claim 1, further comprising a clip circuit connected to the signal line.

7. The semiconductor device according to claim 1, further comprising a boost circuit connected to the signal line.

8. The semiconductor device according to claim 1, further comprising a third semiconductor component disposed between the first semiconductor component and the second semiconductor component,
   wherein the first connecting portion and the second connecting portion have an electrical path for electrically connecting the first semiconductor component and the second semiconductor component through the third semiconductor component.

9. The semiconductor device according to claim 1,
wherein the first semiconductor component includes a semiconductor layer and an interconnection structure provided over the semiconductor layer, and
wherein the interconnection structure is located between the semiconductor layer and the second semiconductor component.

10. The semiconductor device according to claim 1,
wherein the first semiconductor component includes a semiconductor layer and an interconnection structure provided over the semiconductor layer, and
wherein the semiconductor layer is located between the interconnection structure and the second semiconductor component.

11. The semiconductor device according to claim 10, wherein the first semiconductor component includes through electrodes provided so as to penetrate the semiconductor layer as a part of the first connecting portion and the second connecting portion.

12. The semiconductor device according to claim 1,
wherein the first semiconductor component includes a first electrode as a part of the first connecting portion and a second electrode as a part of the second connecting portion,
wherein the second semiconductor component includes a third electrode as a part of the first connecting portion and a fourth electrode as a part of the second connecting portion,
wherein a metal of the first electrode and a metal of the second electrode are metallic bonded at the first connecting portion, and a metal of the third electrode and a metal of the fourth electrode are metallic bonded at the second connecting portion.

13. The semiconductor device according to claim 1, wherein the first connecting portion and the second connecting portion are provided at positions overlapping the first circuit section.

14. The semiconductor device according to claim 1, wherein the third circuit section has a function of performing Analog-Digital conversion processing.

15. An equipment comprising:
the semiconductor device according to claim 1; and
an optical system configured to form an image of an object on the semiconductor device.

16. An equipment comprising:
the semiconductor device according to claim 1;
an information acquisition unit configured to acquire information based on a signal from the semiconductor device; and
a control unit,
wherein the control unit controls the equipment based on the information.

17. An equipment comprising:
the semiconductor device according to claim 1; and
a device connected to the semiconductor device.

18. The semiconductor device according to claim 1, wherein a voltage drop in a path between the pixel circuit and the processing unit in reading out the signal from the pixel circuit is smaller than that in a path between the pixel circuit and the current source.

* * * * *